(12) United States Patent
Sekimoto

(10) Patent No.: US 12,200,948 B2
(45) Date of Patent: Jan. 14, 2025

(54) SOLAR BATTERY

(71) Applicant: Panasonic Intellectual Property Management Co., Ltd., Osaka (JP)

(72) Inventor: Takeyuki Sekimoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 18/357,112

(22) Filed: Jul. 22, 2023

(65) Prior Publication Data

US 2024/0023349 A1 Jan. 18, 2024

Related U.S. Application Data

(63) Continuation of application No. PCT/JP2021/045240, filed on Dec. 9, 2021.

(30) Foreign Application Priority Data

Feb. 18, 2021 (JP) ................. 2021-024719

(51) Int. Cl.
*H10K 30/50* (2023.01)
*H10K 30/40* (2023.01)
*H10K 30/86* (2023.01)
*H10K 85/50* (2023.01)
*H10K 85/60* (2023.01)

(52) U.S. Cl.
CPC ............ *H10K 30/50* (2023.02); *H10K 30/40* (2023.02); *H10K 30/86* (2023.02); *H10K 85/6576* (2023.02); *H10K 85/50* (2023.02)

(58) Field of Classification Search
CPC ........ H10K 30/50; H10K 30/40; H10K 30/86; H10K 85/6576; H10K 85/50; H10K 30/85; H10K 85/615; H10K 85/654; H10K 85/6572; Y02E 10/549
See application file for complete search history.

(56) References Cited

U.S. PATENT DOCUMENTS

2016/0380125 A1 12/2016 Snaith et al.

FOREIGN PATENT DOCUMENTS

| CN | 109904318 | 6/2019 |
|---|---|---|
| JP | 2017-501576 | 1/2017 |

(Continued)

OTHER PUBLICATIONS

Wu, "Efficient inverted perovskite solar cells with preferential orientation and suppressed defects of methylammonium lead iodide by introduction of phenothiazine as additive", Journal of Alloys and Compounds, vol. 823, May 15, 2020, 153717 (Year: 2020).*

(Continued)

*Primary Examiner* — Angelo Trivisonno
(74) *Attorney, Agent, or Firm* — GREENBLUM & BERNSTEIN, P.L.C.

(57) ABSTRACT

A solar battery of the present disclosure includes a first electrode; a photoelectric conversion layer; an intermediate layer; and a second electrode that are arranged in this order. The photoelectric conversion layer contains a perovskite compound. The intermediate layer contains a heterocyclic compound, the heterocyclic compound contains one or more and three or less six-membered rings, and at least one of the six-membered rings has 1-position and 4-position each occupied by an element having a lone pair.

7 Claims, 3 Drawing Sheets

(56) References Cited

FOREIGN PATENT DOCUMENTS

| JP | 2019-091908 | 6/2019 |
|----|-------------|--------|
| JP | 2019-096891 | 6/2019 |

OTHER PUBLICATIONS

International Search Report of PCT application No. PCT/JP2021/045240 dated Mar. 1, 2022.
Ute B. Cappel et al., "Partially Reversible Photoinduced Chemical Changes in a Mixed-Ion Perovskite Material for Solar Cells", ACS Applied Materials & Interfaces, 2017, No. 9, Sep. 19, 2017, pp. 34970-34978.
Takeyuki Sekimoto et al., "Influence of a Hole-Transport Layer on Light-Induced Degradation of Mixed Organic-Inorganic Halide Perovskite Solar Cells", ACS Applied Energy Materials, 2019, vol. 2, Jun. 25, 2019, pp. 5039-5049.
Azat F. Akbulatov et al., "Light or Heat: What Is Killing Lead Halide Perovskites under Solar Cell Operation Conditions?", The Journal of Physical Chemistry Letters, 2020, vol. 11, Dec. 16, 2019, pp. 333-339.
Moon-Soo Lee et al., "Efficient defect passivation of perovskite solar cells via stitching of an organic bidentate molecule", Sustainable Energy & Fuels, 2020, vol. 4, pp. 3318-3325.
Yukun Wu et al., "Efficient inverted perovskite solar cells with preferential orientation and suppressed defects of methylammonium lead iodide by introduction of phenothiazine as additive", Journal of Alloys and Compounds, 2020, vol. 823, Article No. 153717, pp. 1-7.

\* cited by examiner

SOLAR BATTERY

BACKGROUND

1. Technical Field

The present disclosure relates to a solar battery.

2. Description of the Related Art

Recent years have seen advancement in research and development on perovskite solar batteries that use, as a photoelectric conversion material, perovskite crystals represented by chemical formula $ABX_3$ (where A represents a monovalent cation, B represents a divalent cation, and X represents a halogen anion) and analog structures thereof (hereinafter referred to as "perovskite compounds"). Various approaches have been taken to improve the photoelectric conversion efficiency and durability of perovskite solar batteries.

Japanese Patent Nos. 6524095 and 6734412 and Japanese Unexamined Patent Application No. 2019-96891 disclose that perovskite compounds exhibit improved stability to moisture and oxygen when the defect sites of the perovskite compounds are passivated. Japanese Patent Nos. 6524095 and 6734412 and Japanese Unexamined Patent Application No. 2019-96891 disclose that defect sites in the bulk of a perovskite compound are terminated when molecules of a passivation agent (organic compound) chemically bond with anions or cations in the perovskite compound. Japanese Patent Nos. 6524095 and 6734412 and Japanese Unexamined Patent Application No. 2019-96891 also disclose the case in which the passivation agent contains a non-polar organic molecule such as naphthalene or anthracene. A non-polar organic molecule does not chemically bond with anions or cations in the perovskite. However, since the non-polar organic molecule blocks Coulomb interactions between anions and cations at grain boundaries, the grain boundary defect sites become passivated.

Ute B. Cappel and fourteen others, ACS Applied Materials & Interfaces, September 2017, vol. 40, pp. 34970-34978 reports results of analysis on photoinduced chemical changes in perovskite structures by combining visible laser illumination with photoelectron spectroscopy. In a perovskite compound, migration of X ions partially occurs under light illumination, and the surface thereof undergoes phase separation as the iodine ion ($I^-$) and lead ion ($Pb^{2+}$) concentrations decrease and the bromine ion ($Br^-$) concentration increases. This phase separation is canceled in a dark state. In a perovskite compound, zero-valent lead ($Pb^0$) partially reversible under light illumination is also formed, and there has been proposed a photoinduced electron transport mechanism from $I^-$ to $Pb^{2+}$.

In T. Sekimoto and fiver others, ACS Applied Energy Materials, June 2019, vol. 2, pp. 5039-5049, results of analysis by hard X-ray photoelectron spectroscopy on chemically bonding states of an electron transport layer/perovskite compound layer interface and a perovskite compound layer/hole transport layer interface of a perovskite solar battery between before and after light illumination are reported. When a perovskite solar battery is retained in an open state under light illumination, zero-valent iodine ($I^0$ or $I_2$) in the perovskite compound layer serving as a light absorbing layer accumulates near the perovskite compound layer/hole transport layer interface while $Pb^0$ accumulates at the electron transport layer/perovskite compound layer interface. A proposed model is the one in which iodine vacancies accumulate near the electron transport layer/perovskite compound layer interface as iodine accumulates near the perovskite compound layer/hole transport layer interface.

In Azat F. Akbulatov and ten others, The Journal of Physical Chemistry Letters, December 2019, vol. 11, pp. 333-339, partial reversible decomposition of a perovskite compound by heat or light illumination is reported in the absence of oxygen and moisture also. For example, decomposition schemes where $CH_3NH_3PbI_3$ is decomposed into $PbI_2$ and $CH_3NH_3I$, $PbI_2$ is further decomposed into $Pb^0$ and $I_2$, and $CH_3NH_3I$ is decomposed into $CH_3I$, $NH_3$ and other multiple compounds are indicated.

SUMMARY

One non-limiting and exemplary embodiment provides a solar battery having improved thermal durability.

In one general aspect, the techniques disclosed here feature a solar battery that includes a first electrode; a photoelectric conversion layer; an intermediate layer; and a second electrode that are arranged in this order, in which the photoelectric conversion layer contains a perovskite compound, the intermediate layer contains a heterocyclic compound, the heterocyclic compound contains one or more and three or less six-membered rings, and at least one of the six-membered rings has 1-position and 4-position each occupied by an element having a lone pair, and the element having a lone pair is at least one element selected from the group consisting of sulfur and phosphorus.

The present disclosure provides a solar battery with improved thermal durability.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Underlying Knowledge Forming Basis of the Present Disclosure

Figure 1:
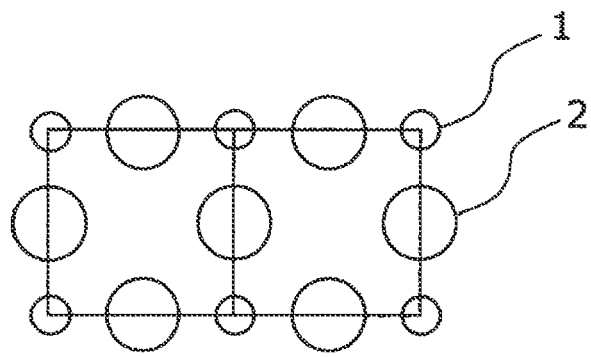
FIG. 1 schematically illustrates the $BX_6$ lattice in the absence of X-site vacancies in a perovskite compound.
Figure 2:
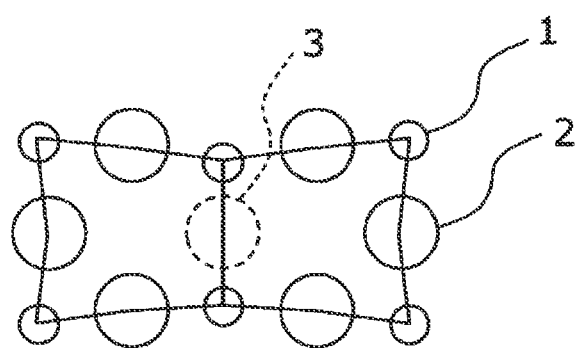
FIG. 2 schematically illustrates a $BX_6$ lattice in the presence of X-site vacancies in the perovskite compound.

Conceivable types of defects in perovskite compounds include atomic vacancies in the individual sites of $ABX_3$ (in other words, A, B, and X), interstitial atoms, and atomic mutual substitutions. The type of generated defects and the generated sites thereof can change according to not only the composition and the production method of the perovskite compound but also, as shown in the aforementioned Ute B. Cappel, T. Sekimoto, and Azat F. Akbulatov, factors such as ambient environments including thermal stress, light illumination, oxygen, moisture, etc. For example, when a perovskite solar battery is held in an open state in a dark place, the internal electric field inside the perovskite compound orients in a direction opposite from that under light illumination. Thus, in a dark place, there is a tendency that the anions at the X sites (hereinafter referred to as the "X ions") localize at the perovskite compound layer/electron transport layer interface while the X-site vacancies localize at the hole transport layer/perovskite compound layer interface. Due to the presence of the X-site vacancies, the $BX_6$ lattice of the perovskite compound becomes distorted. Here, FIG. 1 schematically illustrates the $BX_6$ lattice in the absence of X-site vacancies in the perovskite compound. FIG. 2 schematically illustrates the $BX_6$ lattice in the presence of X-site vacancies in the perovskite compound. In FIGS. 1 and 2, reference sign 1 denotes B ions, reference sign 2 denotes X ions, and reference sign 3 denotes X-site vacancies. In other words, when X-site vacancies 3 are formed, the $BX_6$ lattice of the perovskite compound undergoes distortion from the state illustrated in FIG. 1 to the state illustrated in FIG. 2. Accordingly, when the X-site vacancies localize on the hole transport layer side, the structure of the perovskite compound near the perovskite compound layer/hole transport layer interface becomes distorted and unstable while thermodesorption of the iodine and/or gas derived from the A-site organic cations proceeds from the X-site vacancies at high temperatures. When the structure of the perovskite compound is unstable, the local structures around the vacancies are prone to changes, and the perovskite compound can undergo lattice deformation to facilitate gas desorption.

In order to improve the thermal durability of the perovskite solar battery, desorption of gas from the X-site vacancies needs to be suppressed by terminating the X-site vacancies to moderate the distortion of the structure of the perovskite compound caused by the X-site vacancies near the perovskite compound layer/hole transport layer interface, and to stabilize the structure. In order to terminate the X-site vacancies, an organic molecule having an optimum structure needs to be selected as the passivation agent and needs to be in an appropriate arrangement.

Japanese Patent Nos. 6524095 and 6734412 and Japanese Unexamined Patent Application No. 2019-96891 disclose examples in which an organic molecule, such as pyridine or thiophene, containing one heteroatom is used as a passivation agent. However, in such a passivation agent, there is one element that has a lone pair. Thus, when the X-site vacancies are to be terminated by using such a passivation agent, bonds with cations at the nearby B sites (hereinafter referred to as the "B ions") are insufficient, and there is an issue of insufficient stabilization of the perovskite structure. Here, the B ions are, for example, $B^{2+}$.

Likewise, Japanese Patent Nos. 6524095 and 6734412 and Japanese Unexamined Patent Application No. 2019-96891 describe that grain boundary defects are passivated by using non-polar molecules such as anthracene. However, these non-polar molecules do not contain an element that has a lone pair. Thus, when these non-polar molecules are used as the passivation agent, bonds between the passivation agent that terminates the X-site vacancies and the nearby B ions are absent, and the passivation agent bonds with elements in the perovskite compound through weak hydrogen bonds. This presents an issue in that the stability of the structure of the perovskite compound is insufficient when a non-polar molecule is used to passivate the grain boundary defects.

Figure 3:
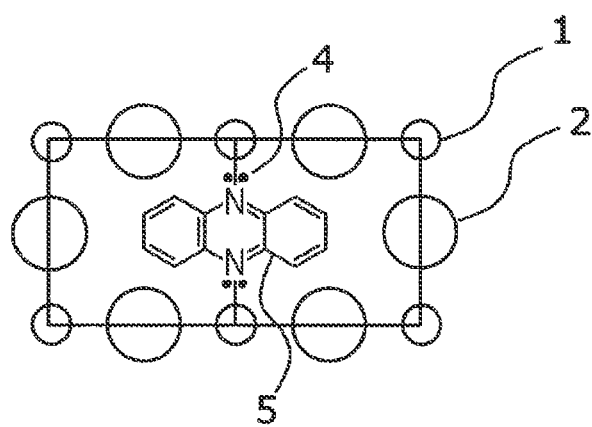
FIG. 3 schematically illustrates a $BX_6$ lattice when X-site vacancies in a perovskite compound are terminated by phenazine, which is a heterocyclic aromatic compound.

The ionic radius of $I^-$, which is one of the X ions, is 220 pm, the ionic radius of $Pb^{2+}$, which is one of the B ions, is 119 pm, and the lattice constant of a typical organic-inorganic perovskite compound is about 600 pm (for example, about 587 pm to 636 pm). Thus, the limit of the size, in one direction, of a molecule that can terminate the defects by entering the iodine vacancies is precited to be at least around 430 pm, which is the $Pb^{2+}$—$Pb^{2+}$ distance. Furthermore, there is also a limit to the size in a direction perpendicular to the aforementioned direction. Accordingly, the number of six-membered rings contained in a molecule that can terminate the defects by entering the X-site vacancies is less than or equal to 3. Here, FIG. 3 schematically illustrates the $BX_6$ lattice when the X-site vacancies in the perovskite compound are terminated by phenazine, which is a heterocyclic aromatic compound. In FIG. 3, reference sign 4 denotes a lone pair, and reference sign 5 denotes a phenazine molecule. Phenazine is a heterocyclic aromatic compound that contains three six-membered rings. As illustrated in FIG. 3, the phenazine molecule 5 can enter an X-site vacancy in the structure of the perovskite compound.

The inventors have made following findings from the studies described heretofore. The heat resistance of a perovskite solar battery is dramatically improved by inserting, at the perovskite compound layer/hole transport layer interface, for example, a layer containing a heterocyclic compound that includes a six-membered ring having the 1-position and the 4-position each occupied by an element having a lone pair. The heterocyclic compound partially terminates the X-site vacancies of the perovskite compound. Furthermore, in a state where the X-site vacancies of the perovskite compound are terminated, the B ions of the perovskite compound are positioned on the side of the two lone pairs at the 1-position and 4-position in the heterocyclic compound. As a result, strong bonds are formed between the lone pairs and the B ions. Thus, the structure of the perovskite compound is stabilized, and thus the thermal durability of the perovskite solar battery is improved.

EMBODIMENTS OF THE PRESENT DISCLOSURE

First Embodiment

A solar battery according to a first embodiment includes a first electrode, a photoelectric conversion layer, an intermediate layer, and a second electrode that are arranged in this order. The photoelectric conversion layer contains a perovskite compound. The intermediate layer contains a heterocyclic compound. The heterocyclic compound contains one or more and three or less six-membered rings, and at least one of the six-membered rings has lone pairs at the 1-position and the 4-position. Here, the photoelectric conversion layer and the intermediate layer may be arranged in contact with each other. Alternatively, another layer may be interposed between the photoelectric conversion layer and the intermediate layer.

According to these features, the heterocyclic compound contained in the intermediate layer partially terminates the defect sites of the perovskite compound contained in the photoelectric conversion layer. Furthermore, in a state where the heterocyclic compound terminates the defect sites of the perovskite compound, the B ions of the perovskite compound come on the side of the two lone pairs at the 1-position and the 4-position of a six-membered ring constituting the heterocyclic compound. Thus, each of the lone pairs at the 1-position and 4-position of the six-membered ring forms a bond with a B ion, and, for example, as illustrated in FIG. 3, two bonds between the lone pairs and the B ions line up straight. Thus, the strong bonds between the lone pairs and the B ions stabilize the structure of the perovskite compound constituting the photoelectric conversion layer. As a result, the solar battery of the first embodiment exhibits high thermal durability.

The perovskite compound has a high light absorption coefficient in the solar spectral wavelength range and a high carrier mobility. The solar battery of the first embodiment, which contains a perovskite compound, has high photoelectric conversion efficiency.

The elements having lone pairs in the heterocyclic compound may each have an atomic radius (or a covalent bond radius) larger than that of oxygen. According to the aforementioned features, the distance between an element having a lone pair and a B ion is shorter, the bond becomes stronger, and thus the structure of the perovskite compound constituting the photoelectric conversion layer becomes more stable. Here, the atomic radius of oxygen is, for example, the atomic radius (65 pm) of oxygen contained in 1,4-dioxin, for example.

The atomic radius of an element having a lone pair is determined by, for example, determining the bonding distance between carbon and the element having a lone pair by measurement such as X-ray diffraction and microwave spectroscopy, and then subtracting the atomic radius of carbon from the bonding distance. Here, the atomic radius of carbon is determined from the carbon-carbon bonding distance.

The element having a lone pair in the heterocyclic compound may be at least one element selected from the group consisting of nitrogen, sulfur, oxygen, and phosphorus. According to this feature, the thermal durability of the solar battery can be further enhanced.

The element having a lone pair may contain sulfur. In a six-membered ring contained in the heterocyclic compound, only the element having a lone pair at the 1-position may be sulfur, only the element having a lone pair at the 4-position may be sulfur, or both of the elements having lone pairs at the 1-position and the 4-position may be sulfur.

The heterocyclic compound may be at least one selected from the group consisting of phenazine, thianthrene, oxanthrene, phenoxathiine, pyrazine, 1,4-dioxin, 1,4-dioxane, 1,4-dithiin, and 1,4-dithiane. According to these features, the thermal durability of the solar battery can be further enhanced.

The heterocyclic compound contained in the intermediate layer may be a heterocyclic aromatic compound. The heterocyclic aromatic compound may be, for example, at least one selected from the group consisting of phenazine, thianthrene, oxanthrene, phenoxathiine, pyrazine, 1,4-dioxin, and 1,4-dithiin. According to these features, the thermal durability of the solar battery can be further enhanced.

Hereinafter, the solar battery according to the first embodiment is described in detail by referring to the drawings.

Figure 4:
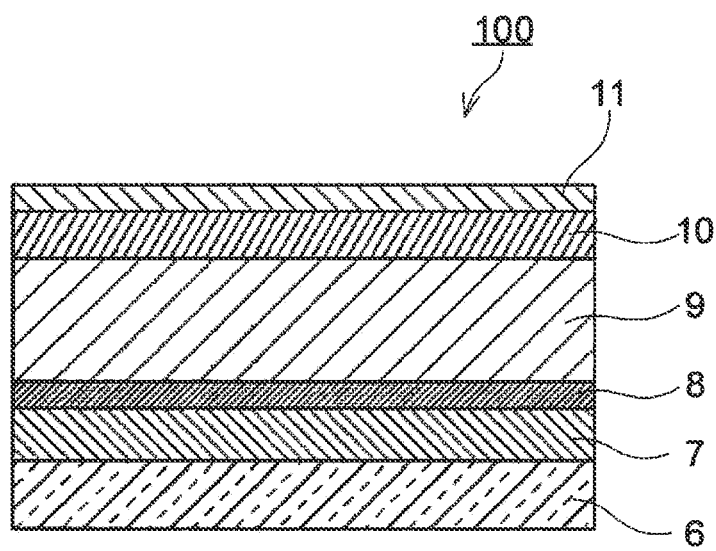
FIG. 4 is a schematic cross-sectional view of a solar battery 100 of a first embodiment.

FIG. 4 is a schematic cross-sectional view of a solar battery 100 of the first embodiment.

The solar battery 100 includes a substrate 6, a first electrode 7, an electron transport layer 8, a photoelectric conversion layer 9, an intermediate layer 10, and a second electrode 11 arranged in this order.

The photoelectric conversion layer 9 contains a perovskite compound.

The intermediate layer 10 contains a heterocyclic compound. The heterocyclic compound contains one or more and three or less six-membered rings, and at least one of the six-membered rings has lone pairs at the 1-position and the 4-position.

According to these features, the solar battery 100 has high thermal durability.

The solar battery 100 may be free of the substrate 6.

The solar battery 100 may be free of the electron transport layer 8.

Once the solar battery 100 is illuminated, the photoelectric conversion layer 9 absorbs light and generates excited electrons and holes. These excited electrons pass through the electron transport layer 8 and migrate to the first electrode 7. Meanwhile, holes generated in the photoelectric conversion layer 9 migrate to the second electrode 11 through the intermediate layer 10. As a result, the solar battery 100 can extract electric current from the first electrode 7 and the second electrode 11. When there are portions not terminated or covered with the intermediate layer 10 in the surface of the photoelectric conversion layer 9, the excited electrons can migrate directly to the second electrode 11.

The first electrode 7 is, for example, a positive electrode. In such a case, the second electrode is a negative electrode.

The solar battery 100 can be produced by, for example, the following method.

First, a first electrode 7 is formed on a surface of the substrate 6 by chemical vapor phase deposition, sputtering, or any other suitable method. Next, an electron transport layer 8 is formed by chemical vapor phase deposition, sputtering, solution coating, or any other suitable method. Next, a photoelectric conversion layer 9 is formed on the electron transport layer 8. For example, a perovskite compound may be sliced to a particular thickness to form a photoelectric conversion layer 9 and this slice may be placed on the first electrode 7. Next, an intermediate layer 10 is formed on the photoelectric conversion layer 9 by chemical vapor phase deposition, solution coating, or any other suitable method. Next, a second electrode 11 is formed on the intermediate layer 10 by chemical vapor phase deposition, sputtering, or any other suitable method. As a result, a solar battery 100 can be obtained.

Second Embodiment

A second embodiment will now be described. The matters already described in the first embodiment may be omitted as appropriate.

The solar battery according to the second embodiment includes all features of the solar battery of the first embodiment and a porous layer. The porous layer is disposed between the electron transport layer and the photoelectric conversion layer.

According to this structure, a photoelectric conversion layer is more easily formed. When there is a porous layer, the material for the photoelectric conversion layer enters the voids in the porous layer, and thus the porous layer lays the foundation for the photoelectric conversion layer. Thus, the incidence of repulsion and aggregation of the material for the photoelectric conversion layer at the surface of the porous layer is reduced. Thus, the photoelectric conversion layer can be formed easily as an even film. Furthermore, since the porous layer scatters light, an effect of increasing the optical path length of the light passing through the photoelectric conversion layer can also be expected.

Figure 5:
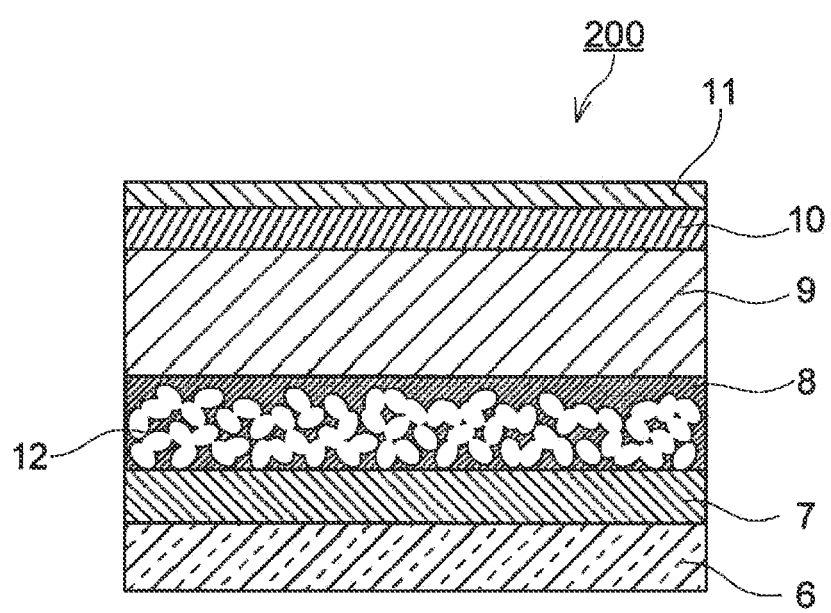
FIG. 5 is a schematic cross-sectional view of a solar battery 200 of a second embodiment.

FIG. 5 is a schematic cross-sectional view of a solar battery 200 of the second embodiment.

The solar battery 200 includes a substrate 6, a first electrode 7, an electron transport layer 8, a porous layer 12, a photoelectric conversion layer 9, an intermediate layer 10, and a second electrode 11 arranged in this order.

The porous layer 12 includes a porous body. The porous body includes voids.

The solar battery 200 may be free of the substrate 6.

The solar battery 200 may be free of the electron transport layer 8.

Third Embodiment

A third embodiment will now be described. The matters already described in the first and second embodiments may be omitted as appropriate.

The solar battery according to the third embodiment includes all features of the solar battery of the first embodiment and a hole transport layer. The hole transport layer is disposed between the intermediate layer and the second electrode.

According to this structure, holes can efficiently migrate to the second electrode. As a result, the solar battery of the third embodiment can efficiently extract electric current. Furthermore, since the intermediate layer is placed between the photoelectric conversion layer and the hole transport layer, the defect sites of the structure of the perovskite compound constituting the photoelectric conversion layer are terminated, and the B ions come on the side of the two lone pairs of the heterocyclic compound; thus, the lone pairs and the B ions form strong bonds. As a result, the structure of the perovskite compound constituting the photoelectric conversion layer becomes stable. Thus, the solar battery of the third embodiment exhibits high heat resistance.

Figure 6:
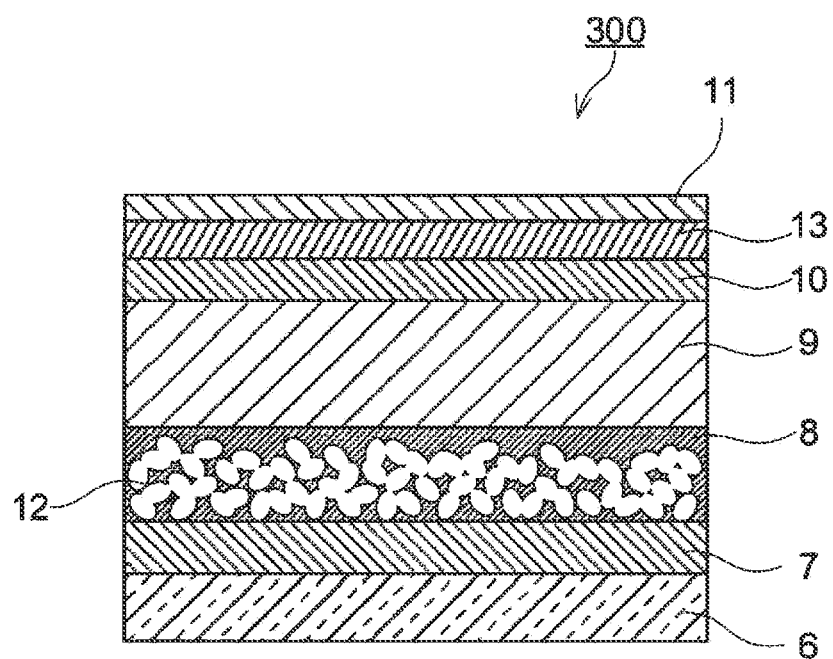
FIG. 6 is a schematic cross-sectional view of a solar battery 300 of a third embodiment.

FIG. 6 is a schematic cross-sectional view of a solar battery 300 of the third embodiment.

The solar battery 300 includes a substrate 6, a first electrode 7, an electron transport layer 8, a porous layer 12, a photoelectric conversion layer 9, an intermediate layer 10, a hole transport layer 13, and a second electrode 11 arranged in this order.

The solar battery 300 has high thermal durability.

The solar battery 300 may be free of the substrate 6.

The solar battery 300 may be free of the electron transport layer 8.

The solar battery 300 may be free of the porous layer 12.

Once the solar battery 300 is illuminated, the photoelectric conversion layer 9 absorbs light and generates excited electrons and holes. These excited electrons migrate to the electron transport layer 8. Meanwhile, holes generated in the photoelectric conversion layer 9 migrate to the hole transport layer 13 through the intermediate layer 10. The electron transport layer 8 connects to the first electrode 7, and the hole transport layer 13 connects to the second electrode 11. As a result, the solar battery 300 can extract electric current from the first electrode 7 and the second electrode 11.

The individual constitutional elements of the solar battery will now be described in specific details.

Substrate 6

The substrate 6 is an optional constitutional element. The substrate 6 has a role of supporting the layers of the solar battery. The substrate 6 can be made of a transparent material. Examples of the substrate 6 include glass substrates and plastic substrates. The plastic substrate may be, for example, a plastic film. When the second electrode 11 is light-transmitting, the material for the substrate 6 may be a material that does not transmit light. Examples of the material for the substrate 6 include metals, ceramics, and resin materials with lower light-transmittance. When the first electrode 7 has a sufficient strength, the substrate 6 may be omitted since the first electrode 7 can support the layers.

First Electrode 7

The first electrode 7 has electrical conductivity. When the solar battery does not include the electron transport layer 8, the first electrode 7 is made of a material that does not form an ohmic contact with the photoelectric conversion layer 9. Furthermore, the first electrode 7 has a property to block holes from the photoelectric conversion layer 9. The property to block holes from the photoelectric conversion layer 9 means the property that passes only the electrons generated in the photoelectric conversion layer 9 and prevents holes from passing. Materials having such a behavior are materials having a higher Fermi energy than the energy at the upper edge of the valence band of the photoelectric conversion layer 9. The aforementioned materials may have a Fermi energy higher than the Fermi energy of the photoelectric conversion layer 9. A specific example of the material is aluminum. When the solar battery includes the electron transport layer 8 between the first electrode 7 and the photoelectric conversion layer 9, the first electrode 7 does not have to have a property to block holes migrating from the photoelectric conversion layer 9. The first electrode 7 may be composed of a material that can form an ohmic contact with the photoelectric conversion layer 9.

The first electrode 7 has a light-transmitting property. For example, light from the visible range to the infrared range may be transmitted. The first electrode 7 is, for example, formed by using a metal oxide and/or a metal nitride that is transparent and has electrical conductivity. Examples of such a material include titanium oxide doped with at least one element selected from the group consisting of lithium, magnesium, niobium, and fluorine; gallium oxide doped with at least one element selected from the group consisting of tin and silicon; gallium nitride doped with at least one element selected from the group consisting of silicon and oxygen; tin oxide doped with at least one element selected from the group consisting of antimony and fluorine; zinc oxide doped with at least one element selected from the group consisting of boron, aluminum, gallium, and indium; indium-tin complex oxides; and composites of these.

The first electrode 7 can be formed by using a non-transparent material and forming a light-transmitting pattern. Examples of the light-transmitting pattern include punched metal patterns in which numerous fine through holes are regularly or irregularly arranged into lines, wave lines, or grids. When the first electrode 7 has such a pattern, light can pass through the portions where the electrode material is absent. Examples of the non-transparent electrode material include platinum, gold, silver, copper, aluminum, rhodium, indium, titanium, iron, nickel, tin, zinc, and alloys containing any of these. Alternatively, a conductive carbon material can be used.

The light transmittance of the first electrode 7 may be, for example, greater than or equal to 50% or may be greater than or equal to 80%. The wavelength of the light to be transmitted is dependent on the absorption wavelength of the photoelectric conversion layer 9. The first electrode 7 has, for example, a thickness greater than or equal to 1 nm and less than or equal to 1000 nm.

Electron Transport Layer 8

The electron transport layer 8 contains a semiconductor. The electron transport layer 8 may be a semiconductor having a bandgap greater than or equal to 3.0 eV. Visible light and infrared light can be transmitted to the photoelectric conversion layer 9 by forming the electron transport layer 8 with a semiconductor having a bandgap greater than or equal to 3.0 eV. An example of the semiconductor is an inorganic n-type semiconductor.

Examples of the inorganic n-type semiconductor include oxides of metal elements, nitrides of metal elements, and perovskite oxides. Examples of the oxides of metal elements include oxides of Cd, Zn, In, Pb, Mo, W, Sb, Bi, Cu, Hg, Ti, Ag, Mn, Fe, V, Sn, Zr, Sr, Ga, Si, and Cr. More specific examples include $TiO_2$ and $SnO_2$. An example of the nitride of metal elements is GaN. Examples of the perovskite oxides include $SrTiO_3$ and $CaTiO_3$.

The electron transport layer 8 may be made of a material having a bandgap greater than 6.0 eV. Examples of the material having a band gap greater than 6.0 eV include halides of alkaline metals or alkaline earth metals such as lithium fluoride and calcium fluoride, alkali metal oxides such as magnesium oxide, and silicon dioxide. In such a case, in order to secure the electron transport property of the electron transport layer 8, the electron transport layer 8 is formed to have a thickness less than or equal to 10 nm, for example.

The electron transport layer 8 may include multiple layers of different materials.

Photoelectric Conversion Layer 9

The photoelectric conversion layer 9 contains a perovskite compound. The perovskite compound can be represented by chemical formula $ABX_3$. A represents a monovalent cation. Examples of the monovalent cation include alkali metal cations and organic cations. More specific examples thereof include methyl ammonium cations ($CH_3NH_3^+$), formamidinium cations ($HC(NH_2)_2^+$), ethylammonium cations ($CH_3CH_2NH_3^+$), guanidium cations ($CH_6N_3^+$), potassium cations ($K^+$), cesium cations ($Cs^+$), and rubidium cations ($Rb^+$). B represents divalent lead cation ($Pb^{2+}$) and tin cation ($Sn^{2+}$). X represents a monovalent anion such as halogen anion. The sites of A, B, and X may each be occupied by multiple ions.

The thickness of the photoelectric conversion layer 9 is, for example, greater than or equal to 50 nm and less than or equal to 10 μm. The photoelectric conversion layer 9 can be formed by a solution coating method, a printing method, a vapor deposition method, or any other appropriate method. The photoelectric conversion layer 9 may be formed by slicing a perovskite compound.

The photoelectric conversion layer 9 may mainly contain a perovskite compound represented by chemical formula $ABX_3$. Here, the phrase "photoelectric conversion layer 9 mainly contains a perovskite compound represented by chemical formula $ABX_3$" means that the photoelectric conversion layer 9 contains 90 mass % or more of the perovskite compound represented by chemical formula $ABX_3$. The photoelectric conversion layer 9 may contain 95 mass % or more of a perovskite compound represented by chemical formula $ABX_3$. The photoelectric conversion layer 9 may be composed of a perovskite compound represented by chemical formula $ABX_3$. The photoelectric conversion layer 9 may contain defects or impurities as long as the perovskite compound represented by chemical formula $ABX_3$ is contained.

The photoelectric conversion layer 9 may further contain a compound different from the perovskite compound represented by chemical formula $ABX_3$. Examples of the different compound include compounds having Ruddlesden-Popper-type layered perovskite structures.

Intermediate Layer 10

The intermediate layer 10 contains a heterocyclic compound. The heterocyclic compound contains one or more and three or less six-membered rings, and at least one of the six-membered rings has the 1-position and the 4-position each occupied by an element having a lone pair.

The element having a lone pair may be at least one element selected from the group consisting of nitrogen, sulfur, oxygen, and phosphorus. Examples of such a heterocyclic compound include phenazine, thianthrene, oxanthrene, phenoxathiine, pyrazine, 1,4-dioxin, 1,4-dioxane, 1,4-dithiin, and 1,4-dithiane.

The heterocyclic compound described above may be a heterocyclic aromatic compound.

The intermediate layer 10 may mainly contain the aforementioned heterocyclic compound. Here the "intermediate layer 10 mainly contains the aforementioned heterocyclic compound" means that the intermediate layer 10 contains 90 mass % or more of the heterocyclic compound. The intermediate layer 10 may contain 95 mass % or more of the aforementioned heterocyclic compound. The intermediate layer 10 may be composed of only the aforementioned heterocyclic compound. The intermediate layer 10 may contain impurities as long as the aforementioned heterocyclic compound is contained.

The intermediate layer 10 may further contain a heterocyclic compound different from the aforementioned heterocyclic compound. For example, the intermediate layer 10 may further contain a heterocyclic compound containing four or more six-membered rings. In such a heterocyclic compound containing four or more six-membered rings, at least one of the six-membered rings may have the 1-position and the 4-position each occupied by an element having a lone pair.

The intermediate layer 10 may contain a heterocyclic compound A that includes one or more and three or less six-membered rings, at least one of which has the 1-position and the 4-position each occupied by an element having a lone pair, and a heterocyclic compound B that includes four or more six-membered rings, at least one of which has the 1-position and the 4-position each occupied by an element having a lone pair. When a perovskite compound includes multiple X-site defects connected to one another to form a large X-site vacancy, the heterocyclic compound B can effectively terminate such a large X-site vacancy and can further stabilize the structure of the perovskite compound. Thus, when the intermediate layer 10 contains the heterocyclic compound A and the heterocyclic compound B, the thermal durability of the solar battery can be further improved. In such a case, the content of the heterocyclic compound A in the intermediate layer 10 is larger than the content of the heterocyclic compound B in terms of mass ratio, for example.

The intermediate layer 10 is formed on the photoelectric conversion layer 9 by, for example, chemical vapor phase deposition or solution coating. Some molecules of the heterocyclic compound contained in the intermediate layer 10 terminate the grain boundary and/or surface defects in the photoelectric conversion layer 9. When the surface of the photoelectric conversion layer 9 is not sufficiently covered with the intermediate layer 10, there can be a portion where the photoelectric conversion layer 9 contacts the hole transport layer 13 or the second electrode 11. The intermediate layer 10 does not inhibit hole migration from the photoelectric conversion layer 9 to the hole transport layer 13 or the second electrode 11.

Method for Producing Intermediate Layer 10

One example of the method for producing the intermediate layer 10 will now be described. Although a solution coating method is described as an example here, the method is not limited to this.

First, a solution containing a heterocyclic compound is prepared. This solution is obtained by dissolving a heterocyclic compound in an organic solvent. For example, 2-propanol is used as the organic solvent. The concentration of the heterocyclic compound may be, for example, greater than or equal to 0.01 g/L and less than or equal to 10 g/L.

Next, the photoelectric conversion layer 9 is coated with the aforementioned solution. Examples of the coating method include a doctor blade method, a bar coating method, a spraying method, a dip-coating method, and a spin-coating method. Then an annealing treatment is performed. For example, the annealing treatment may involve annealing on a hot plate at a temperature higher than or equal to 85° C. and lower than or equal to 115° C. for 10 seconds to 30 minutes. Upon completion of annealing, natural cooling to room temperature is performed to obtain a substrate 6 on which an intermediate layer 10 is formed on a photoelectric conversion layer 9. As such, an intermediate layer 10 is formed.

Porous Layer 12

The porous layer 12 is formed on the electron transport layer 8 by, for example, a coating method. When the solar battery does not include the electron transport layer 8, the porous layer 12 is formed on the first electrode 7. The pore structure introduced by the porous layer 12 lays the foundation for forming the photoelectric conversion layer 9. The porous layer 12 does not inhibit light absorption of the photoelectric conversion layer 9 or the electron migration from the photoelectric conversion layer 9 to the electron transport layer 8.

The porous layer 12 includes a porous body. An example of the porous body is a porous body in which insulating or semiconductor grains are connected to each other. Examples of the insulating grains include grains of aluminum oxide and silicon oxide. An example of the semiconductor grains is inorganic semiconductor grains. Examples of the inorganic semiconductor include oxides of metal elements, perovskite oxides of metal elements, sulfides of metal elements, and metal chalcogenides. Examples of the oxides of metal elements include oxides of Cd, Zn, In, Pb, Mo, W, Sb, Bi, Cu, Hg, Ti, Ag, Mn, Fe, V, Sn, Zr, Sr, Ga, Si, and Cr. A more specific example is $TiO_2$. Examples of the perovskite oxides of the metal elements include $SrTiO_3$ and $CaTiO_3$. Examples of the sulfides of metal elements include CdS, ZnS, $In_2S_3$, PbS, $Mo_2S$, $WS_2$, $Sb_2S_3$, $Bi_2S_3$, $ZnCdS_2$, and $Cu_2S$. Examples of metal chalcogenides include CsSe, $In_2Se_3$, $WSe_2$, HgS, PbSe, and CdTe.

The thickness of the porous layer 12 may be greater than or equal to 0.01 μm and less than or equal to 10 μm, or may be greater than or equal to 0.05 μm and less than or equal to 1 μm.

Regarding the surface roughness of the porous layer 12, the surface roughness coefficient given by effective area/projected area may be equal to or greater than 10 or may be equal to or greater than 100. The projected area is the area of a shadow formed behind an object illuminated with light from directly front. The effective area is the actual surface area of the object. The effective area can be calculated from the volume determined from the projected area and the thickness of the object, and the specific surface area and the bulk density of the material constituting the object. The specific surface area is, for example, measured by a nitrogen adsorption method.

The voids in the porous layer 12 are connected to the portion in contact with the photoelectric conversion layer 9 and the portion in contact with the electron transport layer 8. In other words, the voids in the porous layer 12 are interconnected from one of the main surfaces of the porous layer 12 to the other main surface. As a result, the material for the photoelectric conversion layer 9 fills the voids in the porous layer 12 and can reach the surface of the electron transport layer 8. Thus, the photoelectric conversion layer 9 is in direct contact with the electron transport layer 8, and electron exchange is possible.

The presence of the porous layer 12 offers an effect of facilitating the formation of the photoelectric conversion layer 9. When there is a porous layer 12, the material for the photoelectric conversion layer 9 enters the voids in the porous layer 12, and thus the porous layer 12 lays the foundation for the photoelectric conversion layer 9. Thus, the incidence of repulsion and aggregation of the material for the photoelectric conversion layer 9 at the surface of the porous layer 12 is reduced. Thus, the photoelectric conversion layer 9 can be formed easily as an even film. The photoelectric conversion layer 9 can be formed by the coating method, the printing method, the vapor deposition method, etc., described above.

Since the porous layer 12 scatters light, an effect of increasing the optical path length of the light passing through the photoelectric conversion layer 9 can also be expected. It is anticipated that the increase in optical path length increases the amount of electrons and holes generated in the photoelectric conversion layer 9.

Hole Transport Layer 13

The hole transport layer 13 contains a hole transport material. The hole transport material is a material that transports holes. The hole transport layer 13 is made of a hole transport material such as an organic material or an inorganic semiconductor.

Representative examples of the organic material used as the hole transport material include 2,2',7,7'-tetrakis-(N,N-di-p-methoxyphenylamine)9,9'-spirobifluorene, poly[bis(4-phenyl)(2,4,6-trimethylphenyl)amine] (hereinafter, may be abbreviated as "PTAA"), poly(3-hexylthiophene-2,5-diyl), poly(3,4-ethylenedioxythiophene), and copper phthalocyanine.

The inorganic semiconductor used as the hole transport material is a p-type semiconductor. Examples of the inorganic semiconductor include $Cu_2O$, $CuGaO_2$, CuSCN, CuI, $NiO_x$, $MoO_x$, $V_2O_5$, and carbon materials such as graphene oxide.

The hole transport layer 13 may include multiple layers of different materials. For example, the hole transport properties are improved by stacking multiple layers in such a way that the ionization potential of the hole transport layer 13 gradually decreases with respect to the ionization potential of the photoelectric conversion layer 9.

The thickness of the hole transport layer 13 may be greater than or equal to 1 nm and less than or equal to 1000 nm, or may be greater than or equal to 10 nm and less than or equal to 50 nm. Within this range, sufficient hole transport properties can be exhibited, low resistance can be retained, and thus solar power generation can be carried out highly efficiently.

Examples of the method for forming the hole transport layer 13 include a coating method, a printing method, and a vapor deposition method. This is the same as the photoelectric conversion layer 9. Examples of the coating method include a doctor blade method, a bar coating method, a spraying method, a dip-coating method, and a spin-coating method. An example of the printing method is a screen printing method. If necessary, multiple materials may be mixed to form a hole transport layer 13, followed by pressurizing or heat treatment. When the material for the hole transport layer 13 is an organic low-molecular-weight material or an inorganic semiconductor, it is possible to form a hole transport layer 13 by a vacuum vapor deposition method.

The hole transport layer 13 may contain a supporting electrolyte and a solvent. The supporting electrolyte and the solvent have an effect of stabilizing the holes in the hole transport layer 13.

Examples of the supporting electrolyte include ammonium salts and alkali metal salts. Examples of the ammonium salts include tetrabutylammonium perchlorate, tetraethylammonium hexafluorophosphate, imidazolium salts, and pyridinium salts. Examples of the alkali metal salts include lithium perchlorate and potassium boron tetrafluoride.

The solvent contained in the hole transport layer 13 may have excellent ion conductivity. A water-based solvent or an organic solvent may be used. The solvent contained in the hole transport layer 13 may be an organic solvent for higher stability of the solute. Specific examples thereof include heterocyclic compound solvents such as tert-butylpyridine, pyridine, and n-methylpyrrolidone.

An ionic liquid may be used alone as the solvent, or may be mixed with another type of solvent and used. The ionic liquid, which has low volatility and high flame retardancy, is preferable.

Examples of the ionic liquid include imidazolium ionic liquids such as 1-ethyl-3-methylimidazolium tetracyanoborate, pyridine ionic liquids, alicyclic amine ionic liquids, aliphatic amine ionic liquids, and azoniumamine ionic liquids.

Second Electrode 11

The second electrode 11 has electrical conductivity. When the solar battery does not include the hole transport layer 13, the second electrode 11 is made of a material that does not form an ohmic contact with the photoelectric conversion layer 9. Furthermore, the second electrode 11 has a property to block electrons from the photoelectric conversion layer 9. Here, the property to block electrons from the photoelectric conversion layer 9 means the property to pass only holes generated in the photoelectric conversion layer 9 and prevent electrons from passing. Materials having such a behavior are materials having lower Fermi energy than the energy at the lower edge of the conduction band of the photoelectric conversion layer 9. The aforementioned materials may have a Fermi energy lower than the Fermi energy of the photoelectric conversion layer 9. Specific examples of the material include platinum, gold, and carbon materials such as graphene. When the solar battery includes the hole transport layer 13, the second electrode 11 does not have to have a property to block electrons from the photoelectric conversion layer 9. In other words, the material for the second electrode 11 may be a material that makes an ohmic contact with the photoelectric conversion layer 9. Thus, the second electrode 11 can be formed to have a light transmitting property.

Of the first electrode 7 and the second electrode 11, one on the light incident side is to have a light transmitting property. Thus, one of the first electrode 7 and the second electrode 11 does not have to have a light transmitting property. In other words, one of the first electrode 7 and the second electrode 11 does not have to use a light-transmitting material or have a pattern that includes openings that transmit light.

Examples

Hereinafter, the present disclosure will be described in further detail by referring to examples and comparative examples.

In the examples and comparative examples, solar batteries were fabricated by using perovskite compounds, and were evaluated for their initial properties and properties after a heat resistance test.

The structures of the solar batteries of Examples 1 to 3 and Comparative Examples 1 to 3 are as follows. The solar batteries of Examples 1 to 3 and Comparative Examples 2 and 3 had the same structure as the solar battery 300 illustrated in FIG. 6. The solar battery of Comparative Example 1 had the structure of the solar battery 300 but without the intermediate layer 10.

Substrate 6: glass substrate (thickness: 0.7 mm)
First electrode 7: transparent conductive layer, indium-tin complex oxide layer (thickness: 200 nm)
Electron transport layer 8: titanium oxide ($TiO_2$) (thickness: 10 nm)
Porous layer 12: mesoporous structure titanium oxide ($TiO_2$)
Photoelectric conversion layer 9: layer mainly containing $HC(NH_2)_2PbI_3$ (thickness: 500 nm)
Intermediate layer 10: phenazine, thianthrene, pyrazine, acridine, or anthracene (all produced by Tokyo Chemical Industry Co., Ltd.)
Hole transport layer 13: n-butylammonium bromide (produced by Greatcell Solar Materials)-containing layer/ layer mainly containing PTAA (however, tris(pentafluorophenyl)borane (produced by Tokyo Chemical Industry Co., Ltd.) is contained as an additive) (thickness: 50 nm)
Second electrode 11: gold (thickness: 200 nm)

Preparation of Solar Battery

Example 1

First, a substrate 6 that had, on a surface thereof, a transparent conductive layer functioning as a first electrode 7 was prepared. In this example, a glass substrate having a thickness of 0.7 mm was used as the substrate 6.

An indium-tin complex oxide layer was formed as the first electrode 7 on the substrate 6 by a sputtering method.

Next, a layer of titanium oxide serving as the electron transport layer 8 was formed on the first electrode 7 by a sputtering method.

Titanium oxide having a mesoporous structure was used as the porous layer 12. After 30NR-D (produced by Greatcell Solar Materials) was applied to the electron transport layer 8 by spin-coating, a heat treatment was carried out at 500° C. for 30 minutes to form a porous layer 12 composed of titanium oxide having a mesoporous structure.

Next, a raw material solution of a photoelectric conversion material was applied by spin coating so as to form a photoelectric conversion layer 9 containing a perovskite compound. This raw material solution contained 0.92 mol/L of lead(II) iodide (produced by Tokyo Chemical Industry Co., Ltd.), 0.17 mol/L lead(II) bromide (produced by Tokyo Chemical Industry Co., Ltd.), 0.83 mol/L of formamidinium iodide (produced by Greatcell Solar Materials), 0.17 mol/L of methylammonium bromide (produced by Greatcell Solar Materials), 0.05 mol/L of cesium iodide (produced by Iwatani Corporation), and 0.05 mol/L of rubidium iodide (produced by Iwatani Corporation). The solvent of this solution was a mixture of dimethyl sulfoxide (produced by ACROS ORGANICS) and N,N-dimethylformamide (produced by ACROS ORGANICS). The mixing ratio (DMSO:DMF) of dimethyl sulfoxide (DMSO) to N,N-dimethylformamide (DMF) in the raw material solution was 1:4 on a volume ratio basis.

Next, a heterocyclic compound solution was applied to the photoelectric conversion layer 9 by a spin coating method, and then annealing was carried out on a hot plate at 100° C. for 5 minutes to form an intermediate layer 10 containing a heterocyclic compound. Here, phenazine was used as the solute of the heterocyclic compound solution, 2-propanol was used as the solvent, and the solution was adjusted to a concentration of 6.5 mM.

Next, a raw material solution of a hole transport material was applied to the intermediate layer 10 by a spin coating method to form a hole transport layer 13 containing PTAA. The solvent in the raw material solution was toluene (produced by ACROS ORGANICS), and the solution contained 10 g/L of PTAA.

Next, a gold (Au) film was deposited on the hole transport layer 13 by vacuum vapor deposition so as to form a second electrode 11. Thus, a solar battery of Example 1 was obtained.

Example 2

In Example 2, thianthrene was used as the solute of the heterocyclic compound solution. A solar battery of Example 2 was obtained as in Example 1 except for this feature.

Example 3

In Example 3, pyrazine was used as the solute of the heterocyclic compound solution. A solar battery of Example 3 was obtained as in Example 1 except for this feature.

Comparative Example 1

In Comparative Example 1, the intermediate layer 10 was not formed. A solar battery of Comparative Example 1 was obtained as in Example 1 except for this feature.

Comparative Example 2

In Example 2, acridine was used as the solute of the heterocyclic compound solution. A solar battery of Comparative Example 2 was obtained as in Example 1 except for this feature.

Comparative Example 3

In Example 3, anthracene was used as the solute of the heterocyclic compound solution. A solar battery of Comparative Example 3 was obtained as in Example 1 except for this feature.

Measurement of Photoelectric Conversion Efficiency

The photoelectric conversion efficiency of the obtained solar batteries of Examples 1 to 3 and Comparative Examples 1 to 3 was measured.

The photoelectric conversion efficiency of the solar batteries was measured with an electrochemical analyzer (ALS440B produced by BAS Inc.) and a xenon light source (BPS X300BA produced by Bunkoukeiki Co., Ltd.). Prior to the measurement, the light intensity was calibrated to 1 Sun (100 mW/cm$^2$) by using a silicon photodiode. The voltage sweep rate was 100 mV/s. Prior to the measurement, preliminary tuning such as light illumination and application of forward bias for a long time was not conducted. In order to fix the effective area and reduce the influence of scattered light, the solar battery was masked with a black mask having a 0.1 cm$^2$ opening, and light was illuminated from the mask/substrate 6 side. The photoelectric conversion efficiency was measured at room temperature in a dry air (<2% RH). The initial efficiencies of the solar batteries of Examples 1 to 3 and Comparative Examples 1 to 3 measured as such are shown in Table.

Heat Resistance Test

The solar batteries of Examples 1 to 3 and Comparative Examples 1 to 3 were subjected to the following heat resistance test. First, the solar battery was sealed with a UV-curable resin in a nitrogen atmosphere by using a sealing glass having moisture and oxygen getters attached inside. Subsequently, the solar battery sealed in the sealing glass was held in a constant-temperature vessel at 85° C. for 232 hours. The photoelectric conversion efficiency was measured before and after this heat resistance test.

TABLE

| | | Photoelectric conversion efficiency (%) | | |
| --- | --- | --- | --- | --- |
| | Heterocyclic compound | Before heat resistance test (initial efficiency) | After heat resistance test | Thermal degradation rate |
| Example 1 | Phenazine | 17.99 | 14.04 | −22.0 |
| Example 2 | Thianthrene | 18.06 | 16.88 | −6.5 |
| Example 3 | Pyrazine | 18.00 | 14.25 | −20.8 |
| Comparative Example 1 | — | 18.50 | 10.71 | −42.1 |
| Comparative Example 2 | Acridine | 12.17 | 7.99 | −34.3 |
| Comparative Example 3 | Anthracene | 18.10 | 10.20 | −43.6 |

Confirming Effects of Intermediate Layer Containing Heterocyclic Compound

In the solar batteries of Examples 1 to 3, the intermediate layer 10 that contained phenazine, thianthrene, or pyrazine, which was a heterocyclic compound containing one six-membered ring having the 1-position and the 4-position each occupied by an element having a lone pair, was inserted between the photoelectric conversion layer 9 and the hole transport layer 13. Compared to the solar battery of Comparative Example 1 in which no intermediate layer 10 was formed, the solar batteries of Examples 1 to 3 having such a structure exhibited notably high photoelectric conversion efficiency after the heat resistance test and thus the thermal degradation rate was improved. Thus, a solar battery having high thermal durability is obtained by inserting the intermediate layer 10 between the photoelectric conversion layer 9 and the hole transport layer 13.

Confirming Requirements for Heterocyclic Compound

Acridine used as the heterocyclic compound in Comparative Example 2 contains one six-membered ring having nitrogen having a lone pair only at the 1-position. Anthracene used as the heterocyclic compound in Comparative Example 3 contains no six-membered ring having an element having a lone pair. As shown in Table, the photoelectric conversion efficiency and the thermal degradation rate of the solar batteries of Comparative Examples 2 and 3 after the heat resistance test were particularly low compared to the solar batteries of Examples 1 to 3. Furthermore, compared to the solar battery of Comparative Example 1 in which no intermediate layer 10 was formed, the solar batteries of Comparative Examples 2 and 3 exhibited low photoelectric conversion efficiency after the heat resistance test and no prominent improvement was seen in the thermal degradation rate. In particular, the thermal degradation rate of the solar battery of Comparative Example 3 was larger than the solar battery of Comparative Example 1 in which no intermediate layer 10 was present.

Phenazine and pyrazine each contain one six-membered ring that has the 1-position and the 4-position each occupied by nitrogen having a lone pair. Thianthrene contains one six-membered ring that has the 1-position and the 4-position each occupied by sulfur having a lone pair. Meanwhile, acridine and anthracene has zero or one element that has a lone pair. These results show, as indicated in Examples 1 to 3, the lone pairs at the 1-position and the 4-position of a six-membered ring in phenazine, thianthrene, or pyrazine, which has entered iodine vacancies which are X-site vacancies, bond with nearby B ions $Pb^{2+}$, stabilize the perovskite structure, and suppress thermodesorption from the vacancies of gas generated by thermal decomposition reactions. Meanwhile, acridine and anthracene do not sufficiently bond with $Pb^{2+}$, leave the perovskite compound structure unstable, and leave the termination of the iodine vacancies insufficient; presumably thus, pathways for thermodesorption from the vacancies of the gas generated by thermal decomposition reactions remained.

These results could confirm that a solar battery having high thermal durability is obtained by inserting, between a photoelectric conversion layer and a hole transport layer, an intermediate layer made of a heterocyclic compound containing one six-membered ring having the 1-position and the 4-position each occupied by nitrogen having a lone pair.

The present disclosure provides a solar battery having an intermediate layer that contains a heterocyclic compound. The intermediate layer can dramatically improve the thermal durability of the solar battery when inserted between the photoelectric conversion layer and the hole transport layer of the solar battery, for example. Thus, the present disclosure has excellent industrial applicability.

What is claimed is:

1. A solar battery comprising:
    a first electrode;
    a photoelectric conversion layer;
    an intermediate layer; and
    a second electrode that are arranged in this order,
    wherein the photoelectric conversion layer contains a perovskite compound,
    the intermediate layer contains a heterocyclic compound,
    the heterocyclic compound contains one or more and three or less six-membered rings, and at least one of the six-membered rings has 1-position and 4-position each occupied by an element having a lone pair,
    the element having a lone pair occupying the 1-position is one element selected from the group consisting of sulfur and phosphorus, and
    the element having a lone pair occupying the 4-position is one element selected from the group consisting of sulfur and phosphorus.

2. The solar battery according to claim 1, wherein the photoelectric conversion layer and the intermediate layer are in contact with each other.

3. The solar battery according to claim 1, further comprising a hole transport layer,
    wherein the hole transport layer is disposed between the intermediate layer and the second electrode.

4. The solar battery according to claim 1, wherein the element having a lone pair contains sulfur.

5. The solar battery according to claim 1, wherein the heterocyclic compound is at least one selected from the group consisting of thianthrene, 1,4-dithiin, and 1,4-dithiane.

6. The solar battery according to claim 1, wherein the heterocyclic compound is a heterocyclic aromatic compound.

7. The solar battery according to claim 1, wherein each of:
    the element having a lone pair occupying the 1-position, and
    the element having a lone pair occupying the 4-position is sulfur.

* * * * *